(12) United States Patent
Pschenitzka et al.

(10) Patent No.: US 11,043,653 B2
(45) Date of Patent: Jun. 22, 2021

(54) LIGHT-EMITTING DEVICES WITH IMPROVED LIGHT OUTCOUPLING

(71) Applicant: Kateeva, Inc., Newark, CA (US)

(72) Inventors: Florian Pschenitzka, Newark, CA (US); Christopher D. Favaro, Newark, CA (US)

(73) Assignee: KATEEVA, INC., Newark, CA (US)

( * ) Notice: Subject to any disclaimer, the term of this patent is extended or adjusted under 35 U.S.C. 154(b) by 0 days.

(21) Appl. No.: 16/771,157

(22) PCT Filed: Nov. 30, 2018

(86) PCT No.: PCT/US2018/063492
§ 371 (c)(1),
(2) Date: Jun. 9, 2020

(87) PCT Pub. No.: WO2019/125735
PCT Pub. Date: Jun. 27, 2019

(65) Prior Publication Data
US 2021/0005838 A1    Jan. 7, 2021

Related U.S. Application Data

(60) Provisional application No. 62/607,824, filed on Dec. 19, 2017.

(51) Int. Cl.
*H01L 29/08* (2006.01)
*H01L 51/52* (2006.01)

(52) U.S. Cl.
CPC ...... *H01L 51/5253* (2013.01); *H01L 51/5275* (2013.01); *H01L 2251/303* (2013.01)

(58) Field of Classification Search
CPC ............. H01L 51/5253; H01L 51/5275; H01L 51/5256; H01L 27/3211; H01L 2251/303
See application file for complete search history.

(56) References Cited

U.S. PATENT DOCUMENTS

| 9,496,523 B1 | 11/2016 | Xiang |
| 2008/0272367 A1 | 11/2008 | Cok |
| 2010/0127270 A1* | 5/2010 | Yan ............... H01L 29/6675 257/66 |
| 2010/0193818 A1* | 8/2010 | Krummacher ...... H01L 51/5275 257/98 |
| 2011/0132449 A1 | 6/2011 | Ramadas et al. |
| 2011/0198627 A1 | 8/2011 | Maindron et al. |
| 2014/0322549 A1 | 10/2014 | Xu et al. |
| 2016/0126502 A1* | 5/2016 | Furukawa ........... H01L 51/5212 257/40 |
| 2016/0285032 A1* | 9/2016 | Popp ..................... H01L 51/56 |

(Continued)

OTHER PUBLICATIONS

The International Search Report and Written Opinion issued in International Patent Application No. PCT/US18/63492 dated Feb. 8, 2019, pp. 1-7.

*Primary Examiner* — Phuc T Dang
(74) *Attorney, Agent, or Firm* — Hauptman Ham, LLP

(57) ABSTRACT

Optoelectronic devices that include a composite film in a multilayered encapsulation stack are provided. Also provided are methods of forming the light reflection-modifying structures, as well as other polymeric device layers, using inkjet printing. The composite films include a first, lower refractive index domain and a second, higher refractive index domain.

18 Claims, 7 Drawing Sheets

(56) References Cited

U.S. PATENT DOCUMENTS

| | | | |
|---|---|---|---|
| 2016/0329524 A1 | 11/2016 | Cha et al. | |
| 2017/0179091 A1* | 6/2017 | Otto | H01L 33/08 |
| 2017/0290125 A1* | 10/2017 | Yang | H05B 33/12 |
| 2019/0123111 A1* | 4/2019 | Jin | H01L 27/3211 |

* cited by examiner

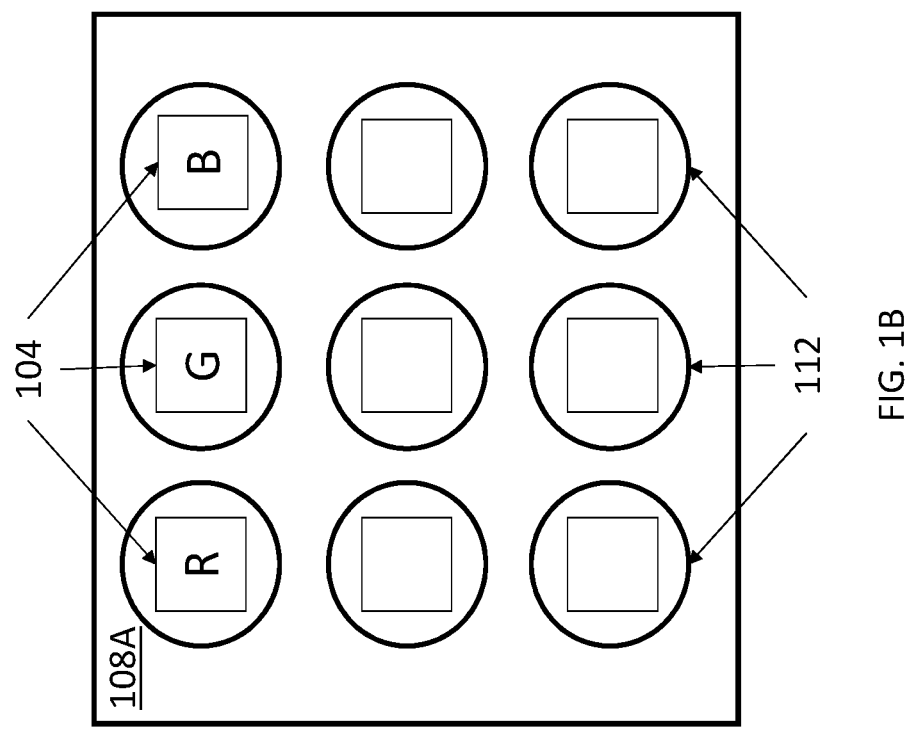

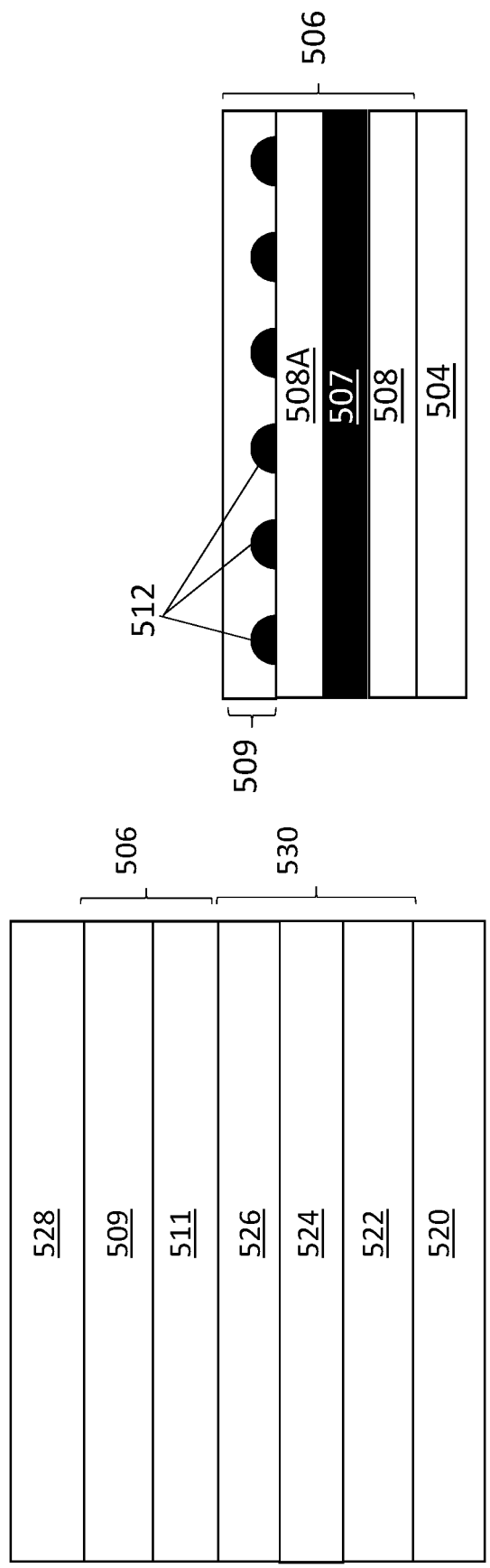

LIGHT-EMITTING DEVICES WITH IMPROVED LIGHT OUTCOUPLING

CROSS-REFERENCE TO RELATED APPLICATIONS

This application is a National Stage of International Application No. PCT/US18/63492, filed Nov. 30, 2018, which claims the benefit of U.S. Patent Application No. 62/607,824, filed Dec. 19, 2017, the contents of which are herein incorporated by reference.

BACKGROUND

Multilayered encapsulation stacks composed of alternating inorganic and organic polymer films have been used to protect light-emitting devices from the damaging effects of exposure to water vapor and oxygen. Unfortunately, the difference between the refractive index (RI) of an inorganic layer in the stack and its neighboring lower refractive index organic polymer layer can result in total internal reflection of the light at the interface between the two layers, which reduces the fraction of light able to exit the device. Moreover, even in the absence of a high RI mismatch between the inorganic and organic polymer layers, light-emitting devices can suffer from limited light output due to total internal reflection of light at the interface between the terminal layer in an encapsulation stack and on overlying device layer or, in the absence of on overlying device layer, at the interface between the terminal layer in an encapsulation stack and air.

FIELD

The inventions described herein relate to encapsulation stacks and light-emitting devices, such as organic light-emitting diode (OLED) devices that include the multilayered encapsulation stacks. The multilayered encapsulation stacks provide reduced total internal reflection and, therefore, improved light output efficiencies relative to conventional encapsulation stacks.

BRIEF DESCRIPTION OF THE DRAWINGS

FIG. 1B is a top view of the OLED device.

FIG. 5A is a schematic diagram showing a cross-sectional view of an OLED device having a composite film at the top of its multilayered encapsulation stack.

FIG. 5B is a schematic diagram showing the multilayered encapsulation stack of FIG. 5A in greater detail.

DETAILED DESCRIPTION

The devices described herein include various electronic and optoelectronic devices in which an active region of the device is encapsulated with a protective multilayered encapsulation stack. In an OLED or other electronic or optoelectronic device, the "active region" need not meet any requirement of amplification of electrical energy or transistor activity, and can refer generally to a region wherein electrical or optoelectrical activity (e.g., light emission, light absorption, or light conversion) can occur. The active region will itself generally be a multilayered structure composed of a plurality of device layers including, for example, electrodes, charge injection layers, charge transport layers, and/or light-emitting layers. Although various benefits of the encapsulation stacks are described below using a top-emitting OLED device as an illustrative example, the encapsulation stacks can be applied to other light-emitting devices, including other top-emitting lighting devices, top-emitting quantum dot (QD)-LED devices, micro-LED displays and QD-photoluminescent (PL) emissive color converters. In addition, this technology can be applied to photosensors and photocells where a high amount of light coupled into the device is advantageous.

Figure 1A:
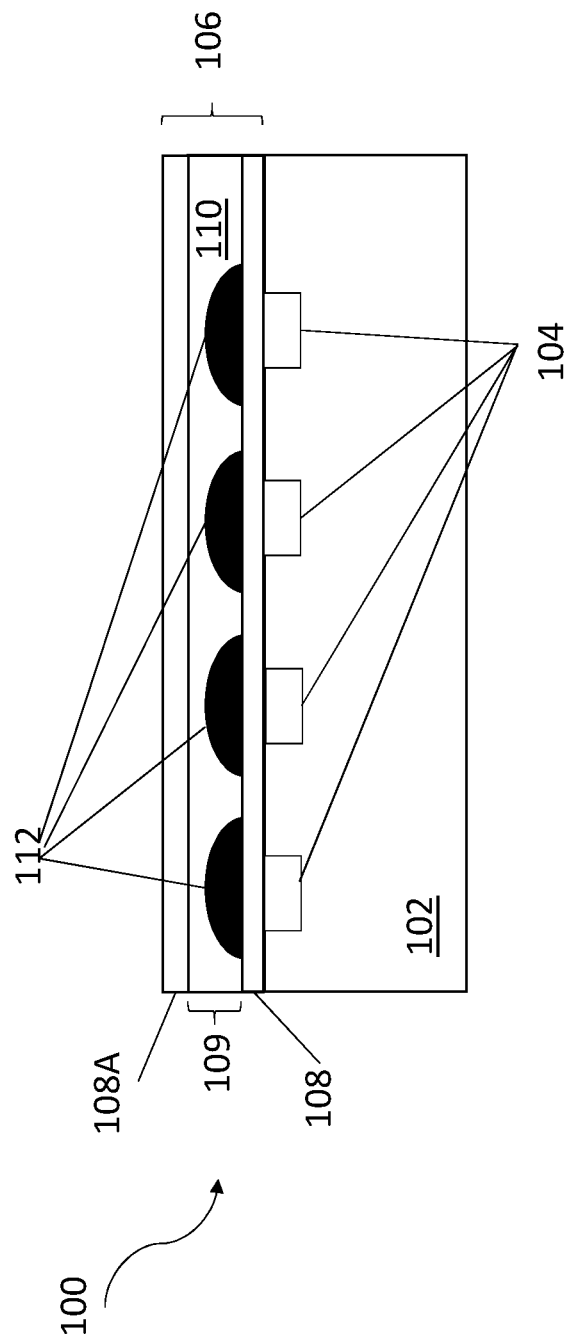
FIG. 1A is a schematic diagram showing a cross-sectional view of one embodiment of an OLED device that includes a multilayered encapsulation stack with a composite film in which a single high refractive index dome-shaped structure is disposed over each sub-pixel of the device.

A schematic diagram shown a cross-sectional view of one embodiment of an OLED device 100 that includes a multilayered encapsulation stack is depicted in FIG. 1A. A top view of the OLED device is shown in FIG. 1B. This embodiment of an OLED device includes a plurality of active regions 104 and an OLED device substrate 102. A multilayered encapsulation stack 106 is disposed over active regions 104. Multilayered encapsulation stack 106, which protects underlying active regions 104 from degradation from exposure to air and/or moisture, includes a first inorganic barrier layer 108 that suppresses the exposure of the active regions 104 to water vapor, oxygen, and/or other reactive gases present in the ambient atmosphere. Adjacent to first inorganic barrier layer 108 is a composite film 109 that includes a first domain comprising a first polymeric layer 110. First polymeric layer 110 is composed of one or more organic polymers and provides a planarization layer to planarize the encapsulation stack. In the embodiment of an OLED device depicted in FIG. 1A, multilayered encapsulation stack 106 includes a second inorganic barrier layer 108A disposed over composite film 109. In other embodiments of the encapsulation stacks, the order of the layers could be reversed, so that the composite film 109 is first fabricated, followed by the fabrication of first inorganic barrier layer 108. In such embodiments, a second planarizing polymeric layer and a second inorganic barrier layer could then be deposited, sequentially, in order to provide sufficient encapsulation for the underlying device. Thus, a modified process includes the deposition of composite film 109 directly on top of an active region of a device, followed by the deposition of a first inorganic barrier layer, followed by the deposition of a second polymeric layer, followed by the deposition of a second inorganic barrier layer. Additionally, more or fewer numbers of inorganic barrier layers and polymeric layers can be provided. For example, the encapsulation stack of FIG. 1A could have a second polymeric layer disposed on second inorganic barrier layer 108A. Active regions 104 of the OLED device of FIG. 1A may be light-emitting sub-pixels (e.g., red, green, and/or blue sub-pixels) embedded in or supported by OLED device 102 substrate. Each of these sub-pixels may include an organic light-emitting layer disposed between a first electrode (e.g., a cathode) and a second electrode (e.g., an anode). Optionally, an electron transport layer and/or an electron injection layer may be disposed between the cathode and the light-emitting layer and a hole transport layer and/or a hole injection layer may be disposed between the anode and the light-emitting layer.

At least one layer in the encapsulation stack is a composite film that includes a first domain formed from a first polymer and a second domain formed from a second polymer, wherein the second domain has a higher RI than the first domain and further wherein the second domain desirably has an RI that is the same as, or nearly the same as, the RI of the inorganic material of first inorganic barrier layer 108. The second domain can be a discontinuous domain that includes a plurality of sub-domains that are typically surrounded by or embedded in the first domain. For example, in the embodiment of the composite film 109 shown in FIG. 1A and FIG. 1B, the sub-domains are a plurality of dome-shaped structures 112. As a result of the reduced RI mismatch between sub-domains 112 and inorganic barrier layer 108, total internal reflection of light emitted from sub-pixels 104 at the interface between inorganic barrier layer 108 and structures 112 is reduced. Suitable RIs for sub-domains 112 will depend on the RI of the inorganic barrier layer. In some embodiments of the multilayered encapsulation stacks, the RIs of the sub-domains and the inorganic barrier layers differ by no more that ±15%, including no more than 10%, and further including no more than 5%. By way of illustration only, for an inorganic barrier layer comprising $SiN_x$ with an RI in the range from about 1.85 to about 2.2, the sub-domains may have an RI of about 1.7 or higher.

The material from which the higher RI domain is made can be a polymeric material comprising one or more organic polymers or a polymer composite, including a polymeric material that contains inorganic particles dispersed in a polymer matrix. Suitable polymers include acrylics, urethanes, and epoxies. Suitable inorganic particles include metal oxide particles, such as zirconium oxides, titanium oxides, hafnium oxides, zinc oxides, and mixtures of two or more thereof. Optionally, the inorganic oxide particles may be surface-functionalized with capping agents that improve their dispersibility in a polymer matrix. Such capping agents may include 2-[2-(2-9-methoxyethoxy)ethoxy] acetic acid and/or methoxy(triethyleneoxy) propyltrimethoxysilane and/or 3 methacryloyloxypropyltrimethoxysilane and/or n-octyl trimethoxysilane and/or dodecyltrimethoxysilane and/or m,p-ethylphenethyl trimethoxysilane. In some embodiments the same metal oxide is present in the higher RI domain of the composite film and the inorganic barrier layer. By way of illustration only, the high RI polymer-nanocrystal composite materials used in the nanocomposite coatings described in U.S. patent publication number 2014/0322549, the entire disclosure of which is incorporated herein by reference, could be used to form the higher RI domain in the composite films of the multilayered encapsulation stacks described herein.

Figure 2:
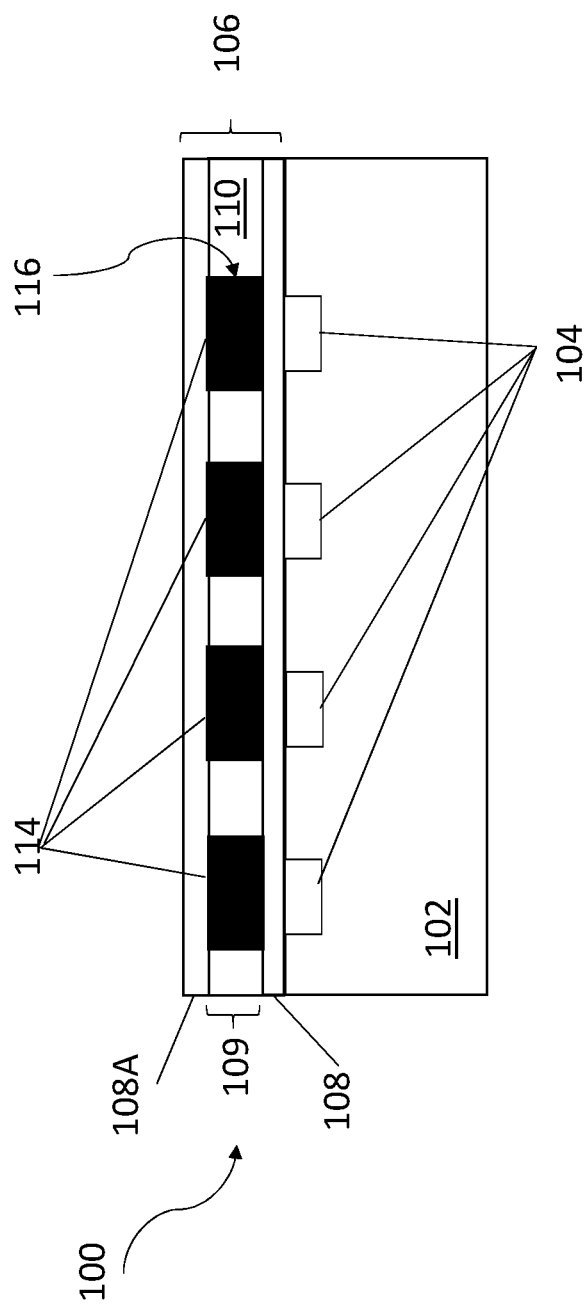
FIG. 2 is a schematic diagram showing a cross-sectional view of a second embodiment of an OLED device that includes a multilayered encapsulation stack with a composite film in which a single high refractive index cylindrical structure is disposed over each sub-pixel of the device.

In the embodiment of the composite film of FIG. 1A, sub-domains 112 provide a non-planar interface between the higher RI material of the sub-domains and the lower RI material of the first domain, so that they change the angle of the light reflected at that interface, such that total internal reflection is suppressed and light outcoupling and extraction is enhanced. In some embodiments of the higher RI domain materials that include particles, the particles may act as scattering centers to further reduce internal reflection and light trapping. However, for applications where light scattering is not desired, the particles may have diameters that are small enough to avoid or minimize light scattering. The sub-domains of the composite films can have a variety of shapes and sizes. For example, as shown in FIG. 1A, the sub-domains can be structures, such as hemispheres (domes) arranged in regular array or a random pattern. Once formed, the structures can be covered with a layer of the lower RI polymeric material of the first domain to form a smooth planar, or substantially planar, surface upon which the next inorganic barrier layer can be formed. Alternatively, the sub-domains can be cylinders 114 arranged in a regular array or a random pattern, as shown in FIG. 2. In this embodiment of the device, the first domain 110 surrounds cylinders 114 and the surface formed by first domain 110 and cylinders 114 provides a smooth planar, or substantially planar, surface upon which the next inorganic barrier layer 108A can be formed. The use of cylindrical structures can be beneficial because light reflected at the vertical interfaces 116 formed between cylindrical sub-domains 114 and first domain 110 can be directed toward the light-emitting surface of the device, further reducing the trapping of light in the first inorganic barrier layer 108 and/or active regions 104.

The dimensions and placement of the sub-domains are not strictly limited, provided that they are able to reduce the total internal reflection within the device. For example, various embodiments of the sub-domains, including the hemispherical structures, have radii in the range from 1 μm to 50 μm, inter-structure spacings (pitch) in the range from 1 μm to 100 μm, and/or heights in the range from 1 μm to 50 μm; although dimensions outside of these ranges can be used. Once formed, the sub-domains can be covered with or laterally encased in a layer of lower RI polymeric material of the first domain to form a smooth planar, or substantially planar, composite film surface upon which the next inorganic barrier layer can be formed. Alternatively, the first domain and the second domain can be formed simultaneous into a composite film having a smooth planar, or substantially planar, surface upon which the next inorganic barrier layer can be formed.

Figure 3:
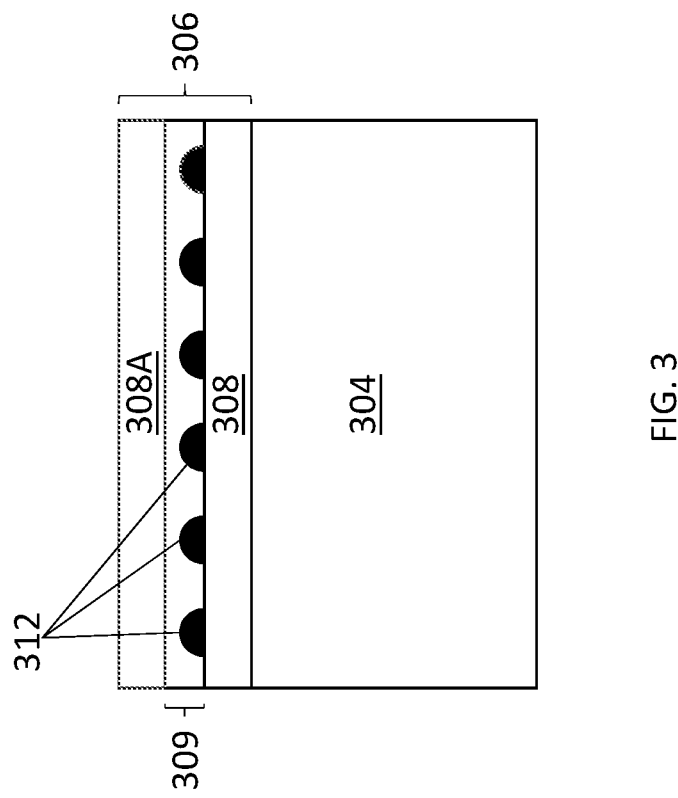
FIG. 3 is a schematic diagram showing a cross-sectional view of one embodiment of an OLED device that includes a multilayered encapsulation stack with a composite film in which multiple high refractive index dome-shaped structures are disposed over each sub-pixel of the device.

To avoid or reduce color bleeding and other undesirable visual effects, the sub-domains can be patterned (e.g., inkjet printed) with a resolution commensurate with the resolution of the display device. For example, in some embodiments of the multilayered encapsulation stacks, there is one sub-domain associated with each pixel or with each sub-pixel within a pixel, as illustrated in FIG. 1A, FIG. 1B, and FIG. 2. In other embodiments, the sub-domains are much smaller than the pixels or sub-pixels, such that a plurality of the sub-domains is disposed over each pixel or sub-pixel. For example, the sub-domains can be localized in clusters over each pixel or sub-pixel in a display device. This is illustrated schematically in FIG. 3, which shows a cross-sectional view of a portion of a display device including an OLED sub-pixel 304 over which an encapsulation stack 306 is disposed. Encapsulation stack 306 includes a first inorganic barrier layer 308, a composite film 309 comprising a first domain 310, a second domain comprising a plurality of dome-shaped sub-domains 312 clustered over OLED 304, and a second inorganic barrier layer 308A over composite film 309.

Figure 4:
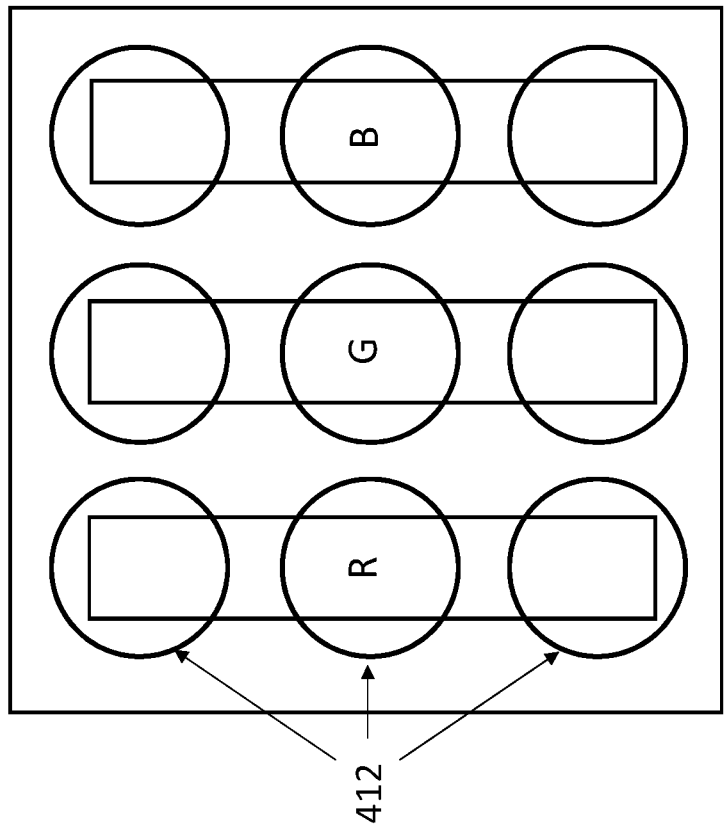
FIG. 4 is a schematic diagram showing a top view of another embodiment of an OLED device that includes a multilayered encapsulation stack with a composite film in which multiple high refractive index dome-shaped structures are disposed over each sub-pixel of the device.

The concept of having more than one sub-domain of a composite film localized over a single sub-pixel is further illustrated in FIG. 4, which shows a top view of three sub-pixels (red (R), green (G), and blue (B)), each of which is associated with three overlying sub-domain 412 of a composite film.

An advantage of implementing the composite film on top of the first (i.e., lowermost) inorganic barrier layer in a multilayered encapsulation stack, rather than at the top of the encapsulation stack, is that such placement reduces the distance between the light-emitting layer of the sub-pixels and the high RI sub-domains of the composite film. This is advantageous because it helps to reduce color bleeding, which can decrease the perceived resolution, the black contrast, and/or the color gamut of the OLED display.

Although the composite film in the device embodiments shown in FIG. 1A, FIG. 1B, and FIG. 2, is positioned directly on the first inorganic barrier layer of the encapsulation stack, in other embodiments, the composite film can be formed on a second (or higher) inorganic barrier layer within the encapsulation stack. For example, the composite film can be placed on the top inorganic barrier layer of an encapsulation stack, as shown in the OLED device depicted in FIG. 5A and FIG. 5B. In addition, composite films can be provided on more than one inorganic barrier layer in a multilayered encapsulation stack. In still other embodiments, the composite film can be placed directly on the top surface of the underlying active regions (for example, on the top electrode of an OLED stack to provide the first layer of the encapsulation stack.

In embodiments in which the composite film is placed on the second or higher inorganic barrier in an encapsulation stack, all of the layers in the encapsulation stack underlying the composite film, including the polymeric planarization layers, should be made of high RI materials. In such embodiments, the underlying planarization layers can have the same material composition as the second domain in the composite film. However, the planarization layers and the second domain of the composite film need not have the same composition, provided that the planarization layers have an RI that is the same as, or nearly the same as (e.g., differing by no more than 15%), the RI of the inorganic materials of inorganic barrier layers in the encapsulation stack. By way of illustration only, for an inorganic barrier layer comprising $SiN_x$ with an RI in the range from about 1.85 to about 2.2, the high RI planarization layers may have an RI of about 1.7 or higher.

An embodiment of an OLED display device that includes a composite film as the final layer of an encapsulation stack is illustrated schematically in FIG. 5A. This figure is a cross-sectional view and includes the components of the active region 530 of an OLED device. These include a reflective anode 522, an organic layer stack 524, and a semi-transparent cathode 526. Over active region 530 is disposed an encapsulation stack 506 and a top protective glass layer 528. Organic layer stack 524 may include, from top to bottom, an electron injection layer, an electron transport layer, a light-emitting layer, a hole transport layer, and a hole injection layer. The OLED device may further include a support substrate 520. In the embodiment shown here, the final layer of encapsulation stack 506 comprises a composite film 509 of the type described herein, disposed over the other, underlying encapsulation stack layers 511 (shown here as a single block for simplicity). FIG. 5B shows a more detailed cross-sectional view of encapsulation layer 506 with upper composite film 509. This composite film has a structure similar to that shown in FIG. 3, with the exception that composite film 509 is at the top of the encapsulation stack and the underlaying layers of the encapsulation stack include one of more inorganic barrier layers 507 comprising a high RI material, which may be same material from which sub-domains 512 are formed. For simplicity, all of the layers in the display device shown in FIGS. 5A and 5B are depicted as having the same thickness. However, as one of ordinary skill in the art would understand, the layers would have different thicknesses in a real display device, depending upon their particular functions. For example, the organic layer stack would typically be substantially thinner than the encapsulation stack layers 511 and 509.

The use of a composite film that includes a high RI domain within the layers of an encapsulation stack can significantly enhance the light extraction efficiency and the integrated current efficiency of an OLED device that incorporates the film, relative to an OLED device that does not include such a film, but is otherwise the same. By way of illustration, various embodiments of the encapsulation stacks in accordance with the present teachings increase the extraction efficiency of an OLED device by at least 30% (e.g., by 30% to 40%) and the integrated current efficiency of an OLED device by at least 70% (e.g., by 70% to 100%). In addition, encapsulation stacks that include the composite films can reduce the viewing angle dependence of the emitted light, resulting in a higher quality display.

Examples of inorganic materials useful for fabricating inorganic barrier layers of a multilayered encapsulation stack can include, for example, various nitrides, oxides, and oxynitrides, such as one or more of silicon nitrides ($SiN_x$), silicon oxides, $Al_2O_3$, $TiO_2$, $HfO_2$, and silicon oxynitrides ($SiO_xN_y$). The inorganic barrier layers can be deposited or otherwise formed over active regions and may be blanket coated (e.g., via chemical and/or physical vapor deposition) over the entirety, or substantially the entirety of the exposed surface of a substrate and active regions.

Polymers useful for fabricating the first and second domains of the composite films and the other polymeric planarizing layers of a multilayered encapsulation stack include various polymer materials that are curable using one or more of a thermal (e.g., bake), radiation (e.g., ultraviolet exposure), or other energy-based (e.g., electron beam) curing technique, and once cured can form a polymeric thin film and/or polymeric structure. The various polymeric layers of the encapsulation stacks can be formed using a variety of polymer deposition techniques. In some embodiments of the OLED devices, the polymeric layers of the encapsulation stack, including the composite film, are formed by inkjet printing an ink composition comprising curable monomers, oligomers, and/or polymers onto a substrate (e.g., onto an inorganic barrier layer) and curing the composition to form a polymer film. In addition, the ink compositions may include one or more crosslinking agents, polymerization initiators, and/or solvents. The polymeric planarization layers can also be made by applying the ink compositions onto a device substrate using coating techniques other than inkjet printing, followed by curing the composition to form a polymer film.

Examples of acrylate and methacrylate (collectively referred to herein as (meth)acrylate) monomers that can be included in an ink composition include mono(meth)acrylate monomers, di(meth)acrylate monomers and (meth)acrylate monomers of higher functionality. In various embodiments of the ink compositions, the (meth)acrylate monomers are polyethers. In various embodiments of the ink compositions, the (meth)acrylate monomers are alkoxylated aliphatic di(meth)acrylate monomers. These include neopentyl glycol group-containing di(meth)acrylates, including alkoxylated neopentyl glycol diacrylates, such as neopentyl glycol propoxylate di(meth)acrylate and neopentyl glycol ethoxylate di(meth)acrylate. Other suitable (meth)acrylate monomers include, but are not limited to: alkyl (meth)acrylates, such as methyl (meth)acrylate, ethyl (meth)acrylate, and benzyl methacrylate; cyclic trimethylolpropane formal (meth)acrylate; alkoxylated tetrahydrofurfuryl (meth)acrylate; phenoxyalkyl (meth)acrylates, such as 2-phenoxyethyl (meth)acrylate and phenoxymethyl (meth)acrylate; 2(2-ethoxyethoxy)ethyl (meth)acrylate. Other suitable di(meth) acrylate monomers include 1,6-hexanediol diacrylate, 1, 12 dodecanediol di(meth)acrylate; 1,3-butylene glycol di(meth) acrylate; di(ethylene glycol) methyl ether methacrylate; and polyethylene glycol di(meth)acrylate monomers. Other mono- and di(meth)acrylate monomers that can be included in various embodiments of the ink compositions, alone or in combination, include dicyclopentenyloxyethyl acrylate (DCPOEA), isobornyl acrylate (ISOBA), dicyclopentenyloxyethyl methacrylate (DCPOEMA), isobornyl methacrylate (ISOBMA), and N-octadecyl methacrylate (OctaM). Homologs of ISOBA and ISOBMA (collectively "ISOB(M) A" homologs) in which one or more of the methyl groups on the ring is replaced by hydrogen can also be used.

The multifunctional (meth)acrylate crosslinking agents desirably have at least three reactive (meth)acrylate groups. Thus, the multifunctional (meth)acrylate crosslinking agents can be, for example, tri(meth)acrylates, tetra(meth)acrylates and/or higher functionality (meth)acrylates. Pentaerythritol tetraacrylate or pentaerythritol tetramethacrylate, di(trimethylolpropane) tetraacrylate, trimethylolpropane triacrylate, and di(trimethylolpropane) tetramethacrylate are examples of multifunctional (meth)acrylates that can be used as a primary cross-linking agent. The term 'primary' is used here to indicate that other components of the ink compositions may also participate in crosslinking, although that is not their main functional purpose.

The compositions used to form the nanocomposite coatings in U.S. patent application publication number 2014/0322549 are examples of ink compositions that can be used to form the second domain of the composite films and/or any high RI planarizing layers in the encapsulation stacks. The ink compositions described in U.S. patent application numbers US 20160024322, US 2017/0062762, and US 2017/0358775 are examples of ink compositions that can be used to form the first domain of the composite films and/or other polymeric planarization layers in the multilayered encapsulation stacks.

With respect to properties of ink compositions applied via inkjet printing, the surface tension, viscosity, and wetting properties of the initial ink compositions should be tailored to allow the compositions to be dispensed through an inkjet printing nozzle without drying onto or clogging the nozzle at the temperature used for printing (e.g., room temperature; ca. 25° C.). By way of illustration, some embodiments of the ink compositions used to form polymeric layers have viscosities of between about 10 cP and about 28 cP (including, for example, between about 15 cP and about 26 cP) at 25° C. and surface tensions of between about 28 dynes/cm and about 45 dynes/cm at 25° C. In order to adjust or optimize the ink compositions for inkjet printing, solvents, surfactants, viscosity modifiers, and the like may be included in the ink compositions. Suitable organic solvents include esters and ethers. In addition to addressing the viscosity and surface tension of the ink, the surface energy of the surface onto which the ink composition is deposited can also be modified in order to achieve the desired ink spreading. This can be done by plasma treatment, exposure to gas containing the surface modifiers, and coating of a thin primer layer containing the surface modifiers. It is also possible to deposit these surface modifiers in a patterned fashion and thus force the ink to be pinned at a defined location on the substrate.

Figure 6:
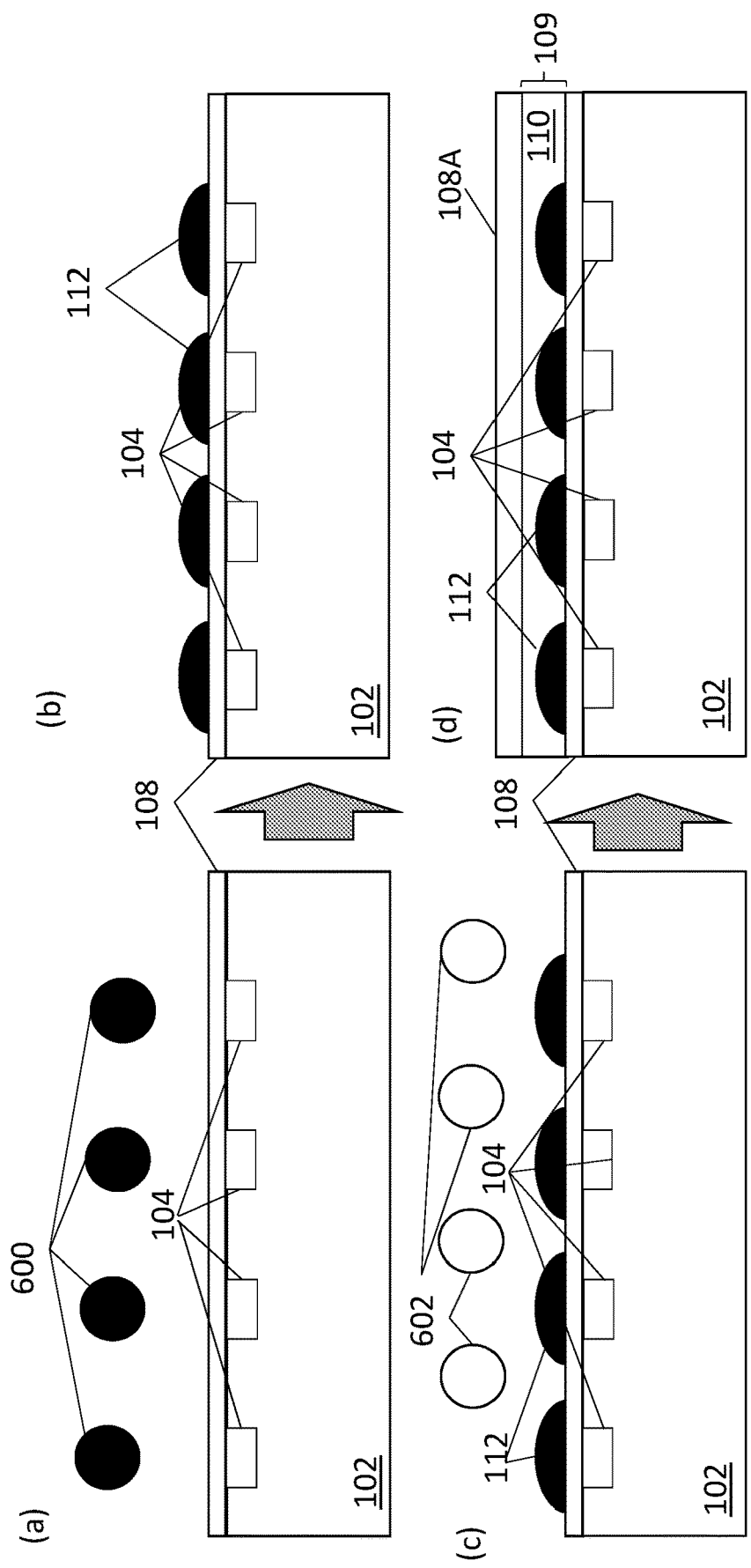
FIG. 6 is a schematic diagram of a method of making the OLED device of FIG. 1A and FIG. 1B.

A method of making an OLED device of the type shown in FIG. 1A and FIG. 1B is illustrated schematically in FIG. 6. Initially, one or more active regions (e.g., sub-pixels) 104 are formed on device substrate 102 and first inorganic barrier layer 108 is deposited as a film over the active regions. Next, droplets of an ink composition 600 comprising the materials that make up the sub-domains of the composite film are deposited (e.g., inkjet printed) onto first inorganic barrier layer 108 over active regions 104 (panel (a)). The droplets spread on the surface and are cured to form the dome-shaped structures 112 (panel (b)). In the embodiment shown here, there is one dome-shaped structure for each active region. If the active regions comprise sub-pixels that emit different colors, the composition of the sub-domains can be independently tailored to meet the desired optical properties for the different sub-pixels. Although not shown here, pixel banks can be used to confine the spreading ink composition 600 after it is printed. Alternatively, ink composition 600 can be confined by patterning the surface of the substrate upon which it is deposited with hydrophobic and/or hydrophilic regions that control the wetting characteristics of the ink composition. Next, droplets of an ink composition 602 comprising the materials that make up the first, lower RI domain of the composite film are deposited (e.g., inkjet printed) as a coating onto first inorganic barrier layer 108 over higher RI structures 112 (panel (c)). The coating is then cured to form the first domain 110. Finally, second inorganic barrier layer 108A is deposited as a film over the first polymeric layer that constitutes the first domain of the composite film 109 (panel (d)). In another approach, the higher RI ink composition 600 is not cured before the deposition of the lower RI ink composition 602. In this case, the two ink compositions are optimized such that they do not intermix, or such that they only partially intermix, so that the outcoupling benefit of the structures in the final device is retained. In a variation to this process, the ink composition that forms sub-domain structures 112 is cured after deposition, but before the lower RI ink composition 602 that forms the first domain is deposited. In this case the interface between the two cured domains is well defined and abrupt. This approach places fewer constraints on the ink composition system because intermixing between the two ink compositions is suppressed by the curing step.

Figure 7:
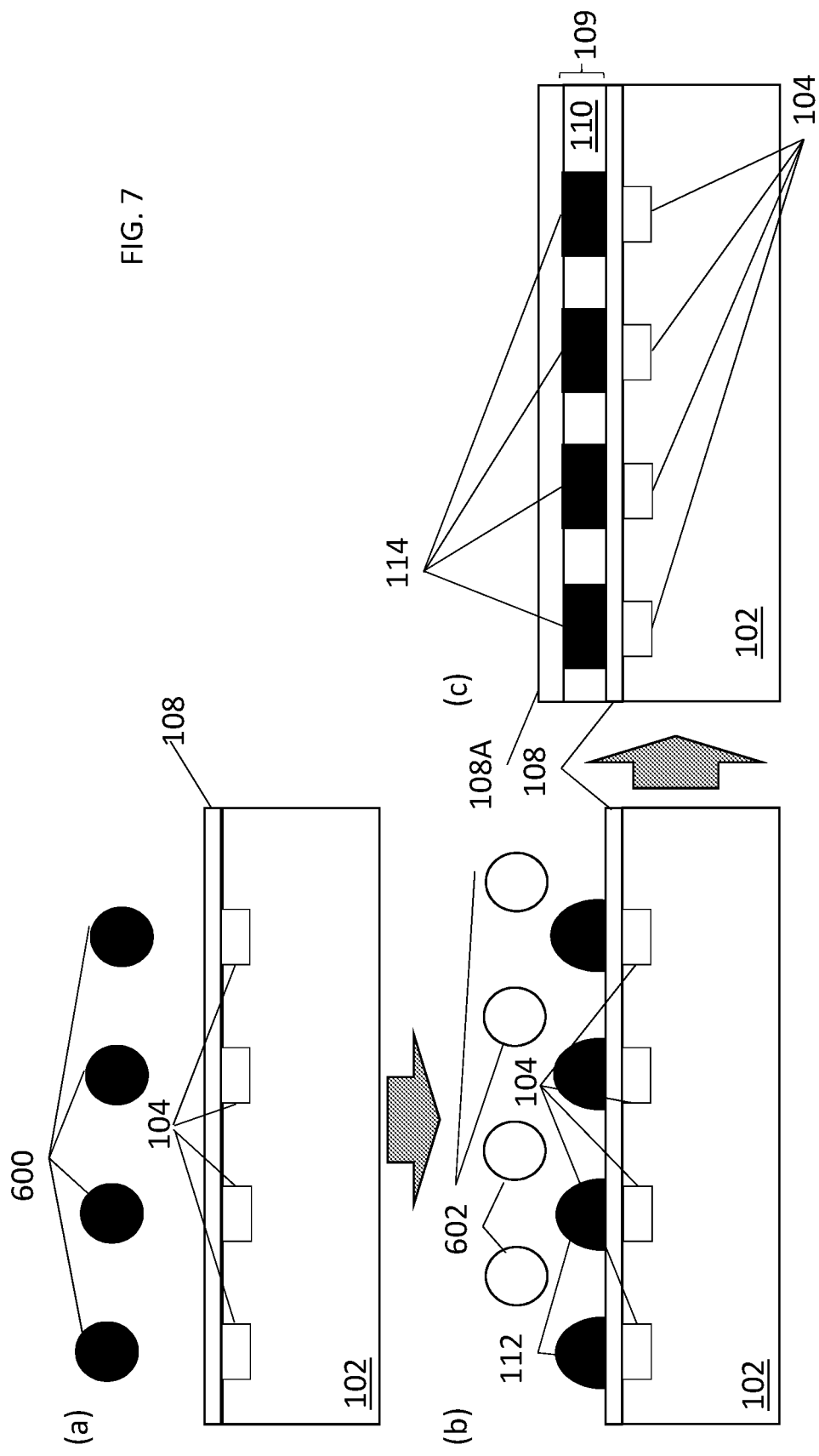
FIG. 7 is a schematic diagram of a method of making the OLED device of FIG. 2.

A method of making an OLED device of the type shown in FIG. 2 is illustrated schematically in FIG. 7. In this method, the ink composition 400 for making the higher RI structures of the sub-domains and the ink composition 602 for making the first domain are designed such that they wet the surface of first inorganic barrier layer 108 similarly to form a planar coating on the surface, but do not substantially intermix within the coating. Droplets of the ink compositions 600 and 602 can be printed (either simultaneously or sequentially) onto first inorganic barrier layer 108 without curing in between the printing steps (panels (a) and (b)) and the coating can then be cured, whereby cylindrical sub-domain structures (or features resembling cones) 114 laterally encased in a polymeric layer of the first domain 110 are formed, followed by the deposition of second inorganic barrier layer 108A (panel (c)). In this method, some intermixing between the ink compositions is allowable, provided that the intermixing zones are relatively small and the RI contrast between the two domains is preserved.

An industrial inkjet printing system that can be housed in an enclosure configured to provide a controlled process environment can be used for the deposition of the ink compositions onto a device substrate. Inkjet printing for the deposition of the ink compositions described herein can have several advantages. First, a range of vacuum processing operations can be eliminated, as inkjet-based fabrication can be performed at atmospheric pressure. Additionally, during an inkjet printing process, an ink composition can be localized to cover portions of an OLED substrate over and proximal to an active region, to effectively encapsulate the active region, including lateral edges of the active region. The targeted patterning using inkjet printing results in eliminating material waste, as well as eliminating additional processing typically required to achieve patterning of an organic thin film, as required, for example, by various masking techniques. The ink compositions can be printed using, for example, a printing system, such as described in U.S. Pat. No. 9,343,678.

The present teachings are intended to be illustrative, and not restrictive. In the Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An optoelectronic device comprising:
   at least one active region; and
   a multilayered encapsulation stack disposed over the at least one active region, the multilayered encapsulation stack comprising:
      an inorganic barrier layer;
      a composite film adjacent to the inorganic barrier layer and comprising a first domain and a second domain, the second domain comprising a plurality of sub-domains, wherein the second domain comprises inorganic particles dispersed in a polymeric matrix and has a higher index of refraction than the first domain.

2. The optoelectronic device of claim 1, wherein the optoelectronic device is an organic light-emitting diode device and the at least one active region comprises a light-emitting pixel.

3. The optoelectronic device of claim 1, wherein the inorganic barrier layer comprises silicon nitride, silicon oxide, or silicon oxynitride.

4. The optoelectronic device of claim 3, wherein the inorganic particles comprise zirconium oxides, titanium oxides, hafnium oxides, zinc oxides, or a mixture of two or more thereof.

5. The optoelectronic device of claim 1, wherein the inorganic particles comprise zirconium oxides, titanium oxides, hafnium oxides, zinc oxides, or a mixture of two or more thereof.

6. The optoelectronic device of claim 5, wherein the polymeric matrix is an acrylic matrix.

7. The optoelectronic device of claim 1, wherein the sub-domains are dome-shaped.

8. The optoelectronic device of claim 1, wherein the sub-domains are cylindrical or conical in shape.

9. A method of forming an encapsulated optoelectronic device, the method comprising:
   forming an inorganic barrier layer over at least one active region of the optoelectronic device;
   inkjet printing a first curable ink composition as a plurality of droplets over the inorganic barrier layer;
   curing the plurality of droplets to form a plurality of sub-domains on the inorganic barrier layer;
   inkjet printing a second ink composition around the plurality of droplets or over the sub-domains; and
   curing the second ink composition to form a first domain comprising a polymeric film around the sub-domains, wherein the sub-domains have a higher index of refraction than the first domain.

10. The method of claim 9, wherein the optoelectronic device is an organic light-emitting diode device and the at least one active region comprises a light-emitting pixel.

11. The method of claim 9, wherein the plurality of droplets is cured to form the plurality of sub-domains before the second ink composition is inkjet printed.

12. The method of claim 11, wherein the sub-domains are dome-shaped.

13. The method of claim 9, wherein the second ink composition is substantially immiscible with the first ink composition and further wherein the second ink composition is printed around the droplets of the first ink composition before the first and second ink compositions are cured.

14. The method of claim 13, wherein the sub-domains are cylindrical or conical in shape.

15. The method of claim 9, wherein the first ink composition comprises inorganic particles and one or more curable monomers, oligomers, or polymers.

16. The method of claim 15, wherein the inorganic particles comprise zirconium oxides, titanium oxides, hafnium oxides, zinc oxides, or a mixture of two or more thereof.

17. The method of claim 16, wherein the one or more curable monomers, oligomers, or polymers comprise one or more acrylate monomers, acrylate oligomers, or acrylate polymers.

18. The method of claim 9, wherein the inorganic particles comprise zirconium oxides, titanium oxides, hafnium oxides, zinc oxides, or a mixture of two or more thereof.

* * * * *